(12) United States Patent
Su et al.

(10) Patent No.: US 8,693,163 B2
(45) Date of Patent: Apr. 8, 2014

(54) CYLINDRICAL EMBEDDED CAPACITORS

(75) Inventors: An-Jhih Su, Bade (TW); Chi-Chun Hsieh, Tongluo Township (TW); Tzu-Yu Wang, Taipei (TW); Wei-Cheng Wu, Hsin-Chu (TW); Hsien-Pin Hu, Zhubei (TW); Shang-Yun Hou, Jubei (TW); Wen-Chih Chiou, Miaoli (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 342 days.

(21) Appl. No.: 12/873,931

(22) Filed: Sep. 1, 2010

(65) Prior Publication Data

US 2012/0049322 A1 Mar. 1, 2012

(51) Int. Cl.
*H01L 29/92* (2006.01)
*H01L 21/768* (2006.01)

(52) U.S. Cl.
USPC ........... 361/278; 361/328; 257/301; 257/302; 257/303; 257/304; 257/305; 257/E21.008

(58) Field of Classification Search
USPC ................ 361/271, 278, 298.2, 298.4, 299.1, 361/301.2, 328
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A * | 12/1999 | Black et al. ................... 438/618 |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |

(Continued)

FOREIGN PATENT DOCUMENTS

CN          1507046          6/2004

OTHER PUBLICATIONS

Giraudin, J.-C., et al., "Development of Embedded Three-Dimensional 35-nF/mm² MIM Capacitor and BiCMOS Circuits Characterization," IEEE Journal of Solid-State Circuits, vol. 42, No. 9, Sep. 2007, pp. 1842-1850.

(Continued)

*Primary Examiner* — Colleen Matthews
*Assistant Examiner* — William Harriston
(74) *Attorney, Agent, or Firm* — Slater & Matsil, L.L.P.

(57) ABSTRACT

A device includes a substrate having a front surface and a back surface opposite the front surface. A capacitor is formed in the substrate and includes a first capacitor plate; a first insulation layer encircling the first capacitor plate; and a second capacitor plate encircling the first insulation layer. Each of the first capacitor plate, the first insulation layer, and the second capacitor plate extends from the front surface to the back surface of the substrate.

15 Claims, 7 Drawing Sheets

(56) References Cited

U.S. PATENT DOCUMENTS

| | | |
|---|---|---|
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 * | 4/2008 | Jackson et al. ............ 257/686 |
| 7,561,410 B1 * | 7/2009 | Lee et al. ................ 361/525 |
| 7,750,477 B2 * | 7/2010 | Sinha ...................... 257/774 |
| 8,159,812 B2 * | 4/2012 | Eriksson .................. 361/323 |
| 8,202,801 B1 * | 6/2012 | Lin ......................... 438/667 |
| 8,254,142 B2 * | 8/2012 | Chen ....................... 361/782 |
| 8,519,515 B2 * | 8/2013 | Kuo et al. ................ 257/621 |
| 2002/0017399 A1 * | 2/2002 | Chang et al. ............. 174/262 |
| 2006/0001174 A1 * | 1/2006 | Matsui ..................... 257/774 |
| 2008/0122031 A1 * | 5/2008 | DeNatale et al. ......... 257/532 |
| 2009/0090995 A1 * | 4/2009 | Yang et al. ............... 257/531 |
| 2009/0161298 A1 * | 6/2009 | Lee et al. ................. 361/525 |
| 2011/0169131 A1 * | 7/2011 | Nakos et al. ............. 257/532 |
| 2011/0177670 A1 * | 7/2011 | Herrin et al. ............. 438/401 |
| 2012/0091593 A1 * | 4/2012 | Cheng et al. ............. 257/774 |
| 2012/0181658 A1 * | 7/2012 | Mohammed et al. ..... 257/532 |

OTHER PUBLICATIONS

Roozeboom, F., et al., "ALD Options for Si-integrated Ultrahigh-density Decouplling Capacitors in Pore and Trench Designs," ESC Transactions, 3 (15) pp. 173-181, 2007, The Electrochemical Society.

Roozeboom, F., et al., "Passive and heterogeneous integration towards a Si-based System-in-Package concept," Thin Solid Films 504, 2006, pp. 391-396, Elsevier.

Roozeboom, F., et al., "Ultrahigh-density trench capacitors in silicon and their application to integrated DC-DC conversion," Procedia Chemistry 1, 2009, pp. 1435-1438, Elsevier.

* cited by examiner

CYLINDRICAL EMBEDDED CAPACITORS

BACKGROUND

Large capacitors with high capacitance values require large chip area, and hence result in difficulty in the formation of integrated circuits. Conventional capacitors include planar-type capacitors and trench-type MOS capacitors. The capacitor plates of the planar-type capacitors are parallel to the major surfaces of the respective substrate. The process for forming the planar-type capacitors is simple. However, planar-type capacitors also require large areas.

On the other hand, trench-type MOS capacitors comprise vertical portions perpendicular to the major surface of the respective substrates, and extending into the respective substrates, and hence the required chip areas are reduced. However, the process for forming the trench-type MOS capacitors is complicated.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9A are cross-sectional views of intermediate stages in the manufacturing of an embedded capacitor in a substrate in accordance with an embodiment;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel capacitor and the method of forming the same are presented in accordance with an embodiment. The intermediate stages of manufacturing an embodiment are illustrated. The variations of the embodiment are then discussed. Throughout the various views and illustrative embodiments, like reference numbers are used to designate like elements.

Figure 1:
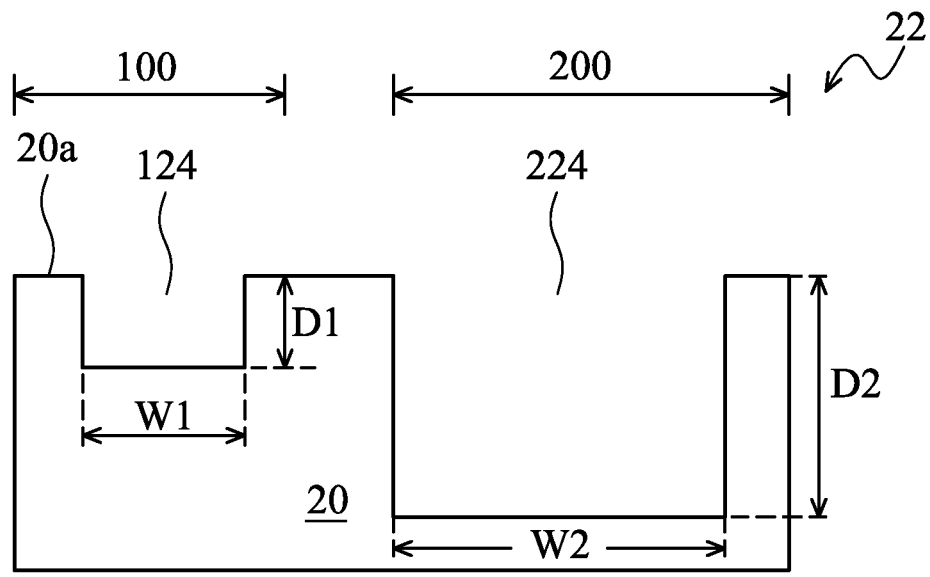

Referring to FIG. 1, substrate 20, which is a part of wafer 22, is provided. In an embodiment, substrate 20 is a semiconductor substrate, which may be a silicon substrate, for example. Other commonly used materials, such as carbon, germanium, gallium, arsenic, nitrogen, indium, phosphorus, and/or the like, may also be included in substrate 20. Substrate 20 may be formed of a single-crystalline or a compound semiconductor material. In an embodiment, substrate 20 is an interposer substrate of an interposer, and there is substantially no active device such as transistors formed at surfaces of substrate 20. Passive devices such as capacitors, inductors, resistors, and the like, however, may, or may not, be formed in wafer 22. In alternative embodiments, substrate 20 is a portion of a device die, and hence integrated circuits such as transistors (not shown in FIG. 1, please refer to FIG. 9) may be formed at a surface of substrate 20. Substrate 20 may also be a dielectric substrate formed of an organic material, a ceramic material, or the like.

Substrate 20 includes portions in different regions 100 and 200. Region 100 is a through-substrate via (TSV) region, in which a TSV is to be formed. Region 200 is a capacitor region in which a capacitor is to be formed. In the illustrated exemplary embodiments, a TSV and a capacitor are simultaneously formed in regions 100 and 200, respectively. However, the TSV and capacitor may be formed by separate process steps.

Openings 124 and 224 are formed in substrate 20, and extend from front surface 20a of substrate 20 into substrate 20. The formation of openings 124 and 224 may include forming and patterning a photo resist (not shown), and then using the photo resist to etch substrate 20. The photo resist is then removed. In an embodiment, openings 124 and 224 have lateral dimensions W1 and W2, respectively, which may be a length/width or a diameter. Lateral dimension W2 may be greater than about 110 percent, 150 percent, or 200 percent lateral dimension W1. When openings 124 and 224 are formed simultaneously in a same etching step, due to the difference in lateral dimensions W1 and W2, depth D1 and D2 will also be different, with depth D2 greater than depth D1.

Figure 2:
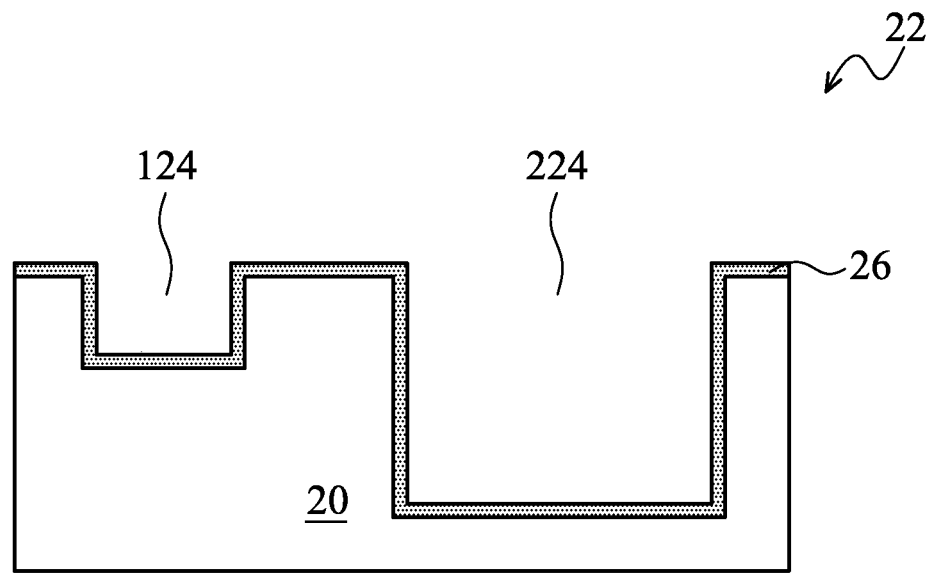

Referring the FIG. 2, isolation layer 26 (alternatively referred to as a liner) is formed to cover the bottoms and sidewalls of openings 124 and 224. In the embodiments wherein substrate 20 is a dielectric substrate, isolation layer 26 may be omitted. Isolation layer 26 may be formed of silicon oxide, silicon oxynitride, silicon nitride, or the like.

Figure 3:
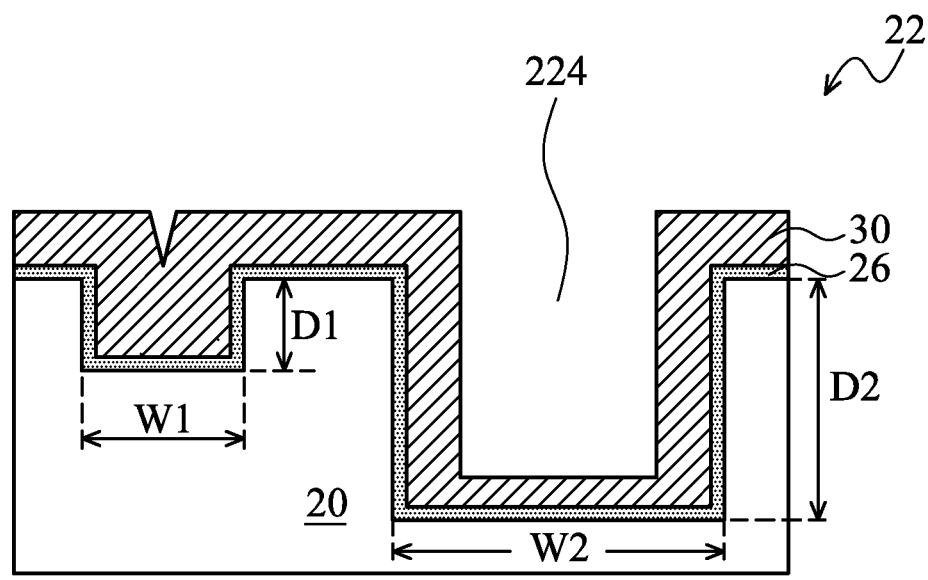

Referring to FIG. 3, conductive layer 30 is formed. The material of conductive layer 30 may include a metallic material such as copper or a copper alloy, although other metallic materials may be used. The material of conductive layer 30 may include a non-metallic material such as polysilicon. The formation of conductive layer 30 may include forming a seed layer using physical vapor deposition (PVD), for example, and then performing a plating to increase the thickness of conductive layer 30. Process may be controlled, and widths W1 and W2 and depths D1 and D2 are also selected, so that opening 124 is fully filled by conductive layer 30, while opening 224 is partially filled. Conductive layer 30 is formed as a conformal layer on the sidewalls and the bottom of opening 224.

Figure 4:
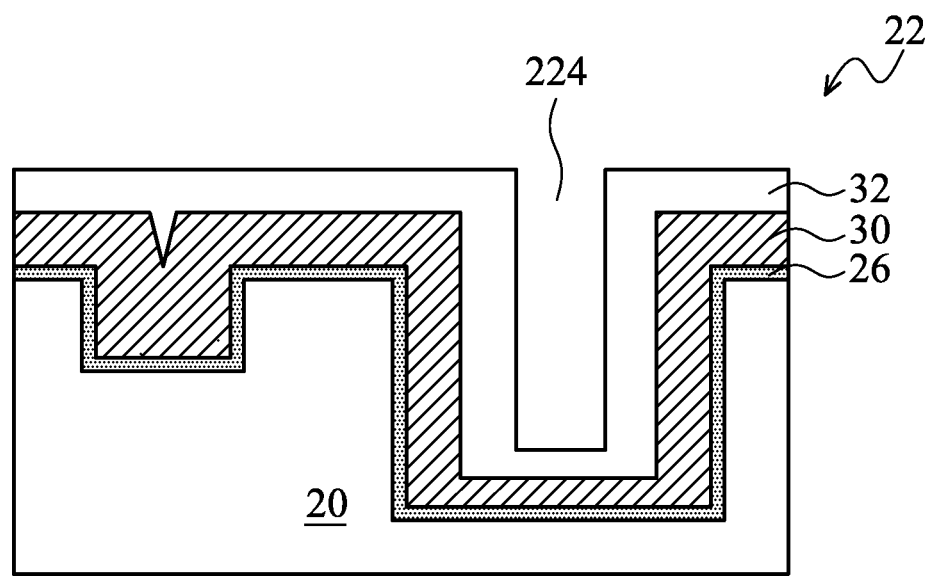

Insulation layer 32 is then formed, and partially fills opening 224, as is shown in FIG. 4. In an embodiment, insulation layer 32 is formed using a deposition technique for forming conformal dielectric layers, such as selective area chemical vapor deposition (SACVD), high aspect ratio process (HARP), or the like. Insulation layer 32 may include silicon nitride, silicon oxide, silicon oxynitride, or the like.

Figure 5:
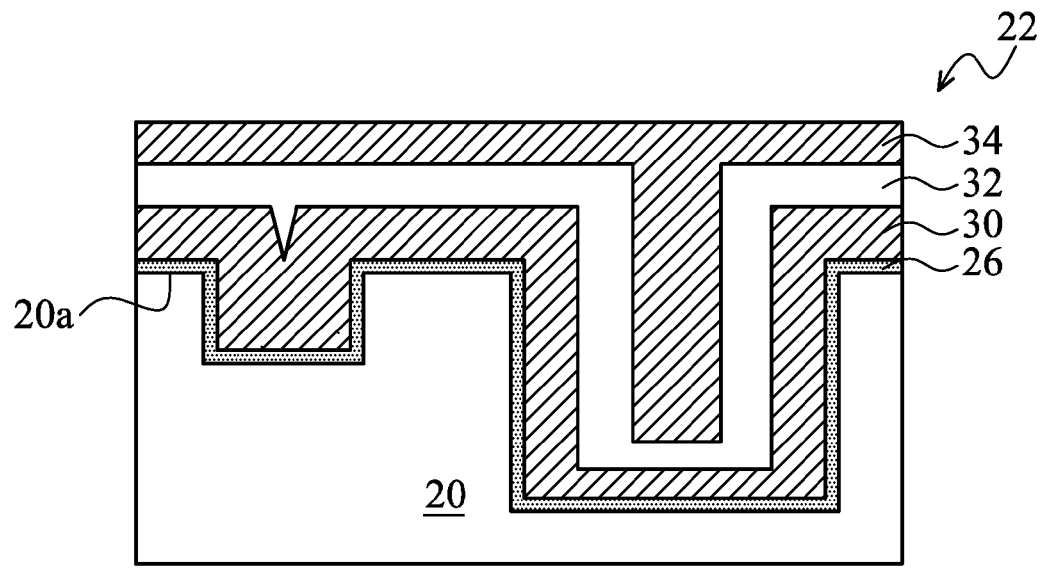
Figure 6:
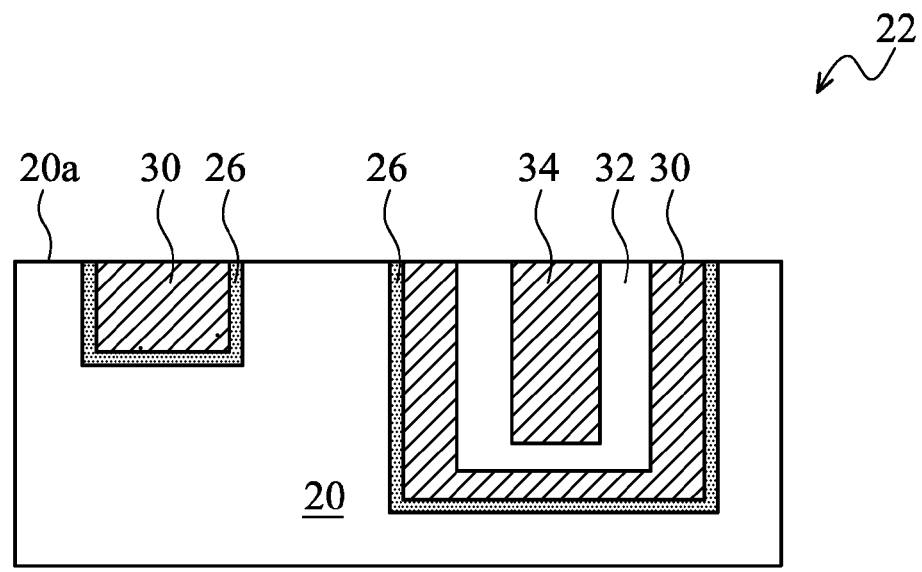

Referring to FIG. 5, the remaining portion of opening 224 is filled with conductive material 34. Conductive material layer 34 may include a metallic material such as copper, tungsten, aluminum, alloys thereof, and multi-layers thereof. The material of conductive material layer 34 may include a non-metallic material such as polysilicon. Next, as shown in FIG. 6, a planarization step is performed, so that excess portions of conductive material layer 34, insulation layer 32, and conductive layer 30 directly over top surface 20a of substrate 20 are removed. The planarization step may be performed using chemical mechanical polish (CMP).

Figure 7:
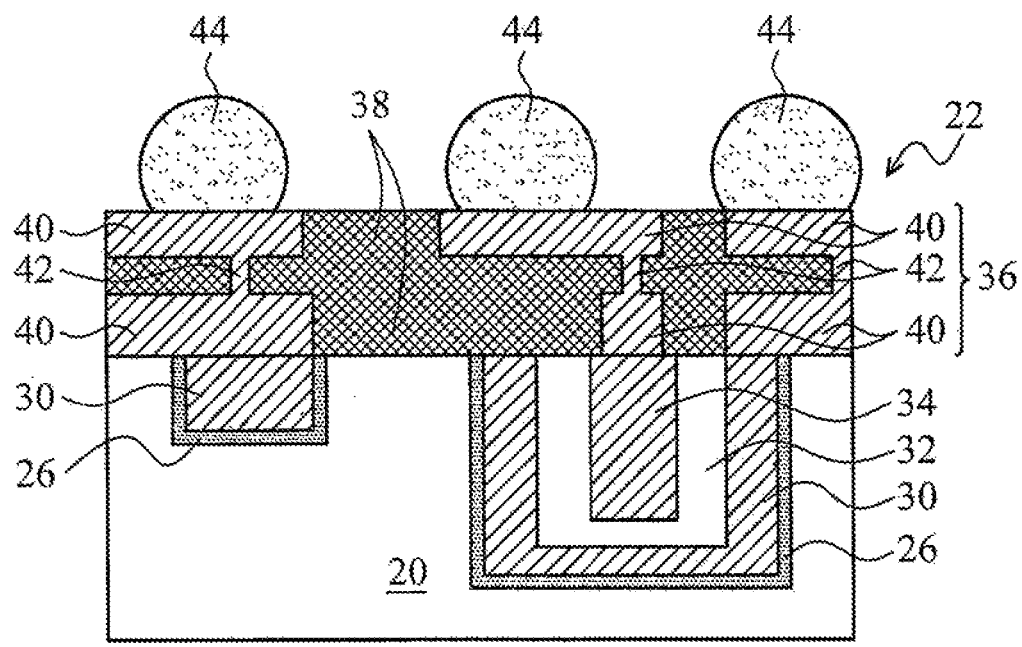

In FIG. 7, front-side interconnect structure 36 is formed. Front-side interconnect structure 36 may include one or a plurality of dielectric layers 38, and metal lines (redistribution lines) 40 and vias 42 in dielectric layers 38. In the embodiments wherein wafer 22 is a device wafer, dielectric layers 38 may include an inter-layer dielectric (ILD) and a plurality of inter-metal dielectrics (IMD), which may be formed of low-k dielectric materials with k values lower than 3.0, for example. Bumps 44 are then formed on the wafer 22. Bumps 44 may be copper pillar bumps, solder bumps, or any other type of commonly used bumps.

Figure 8:
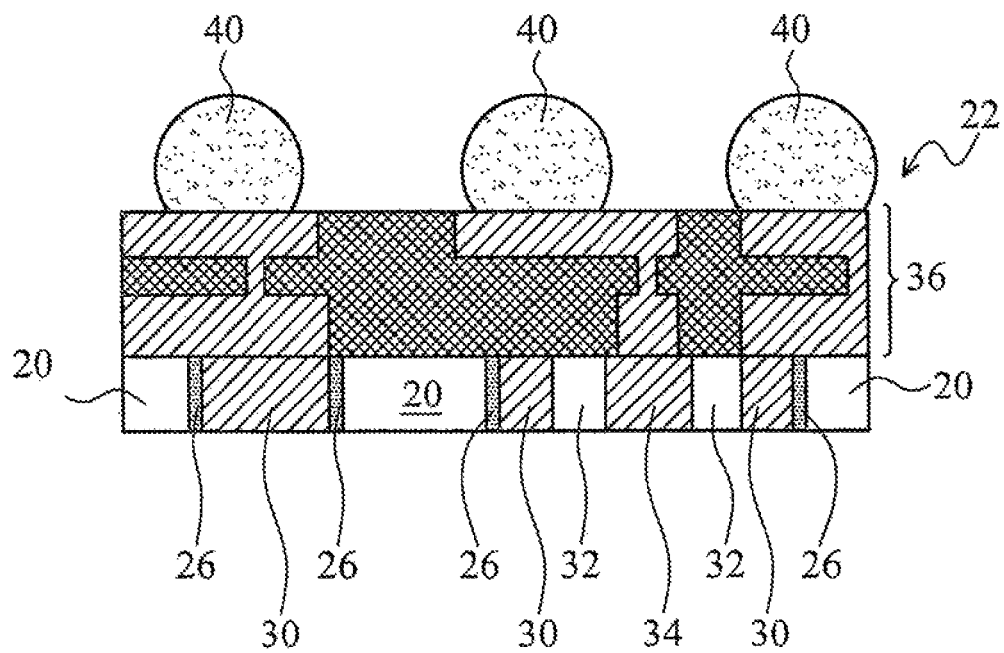
Figure 9A:
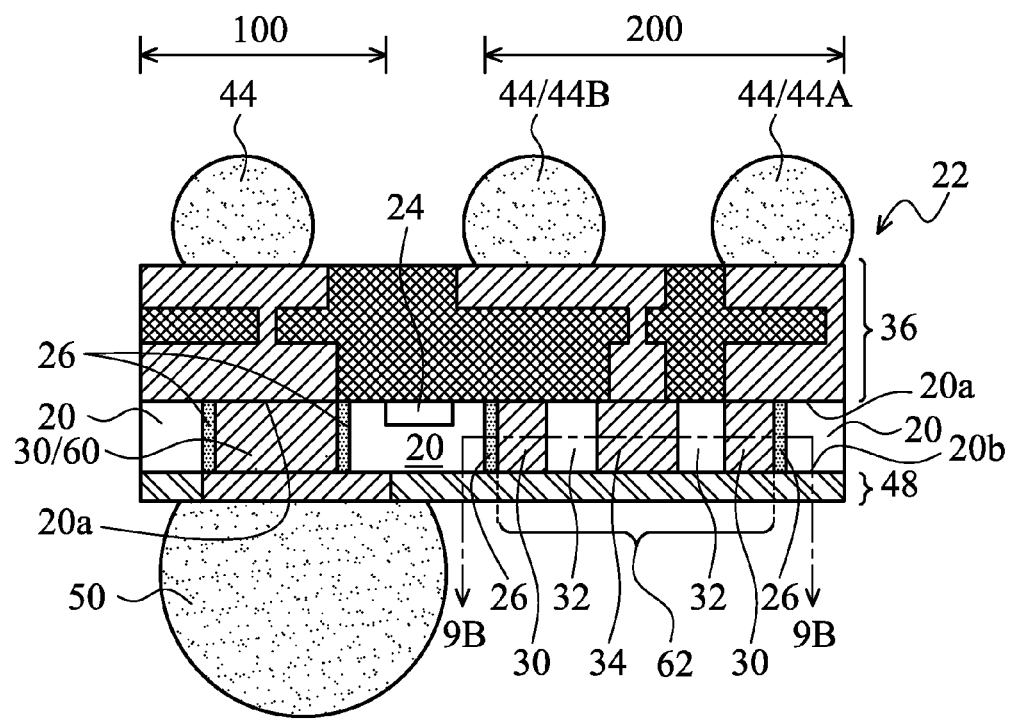

Referring to FIG. 8, in subsequent process steps, the backside of substrate 20 is grinded until conductive layer 30, insulation layer 32, and conductive layer 34 are exposed. Next, as shown in FIG. 9A, backside interconnect structure 48 is formed. Backside interconnect structure 48 may also comprise one or a plurality of dielectric layers, and redistribution lines and vias (not shown) in the dielectric layers. Metal bump 50, which may be a solder bump or a copper pillar bump, is formed on the backside of substrate 20.

In the structure shown in FIG. 9A, the remaining portion of conductive layer 30 in TSV region 100 forms TSV 60, which may be electrically coupled to metal bump 50 and one of metal bumps 44. The remaining portion of conductive layer 30, insulation layer 32, and conductive layer 34 in region 200 form capacitor 62, which includes conductive layer 30 and conductive layer 34 as two capacitor plates, and insulation layer 32 as the capacitor insulator. It is observed that each of capacitor plates 30 and 34 and capacitor insulator 32 extends from front surface 20a to back surface 20b of substrate 20. In an exemplary embodiment as shown in FIG. 9A, capacitor plate 30 is electrically coupled to front-side metal bump 44A, while capacitor plate 34 is electrically coupled to front-side metal bump 44B.

In the case wherein wafer 22 is a device wafer, active devices 24 may be formed at surface 20a of substrate 20. In some embodiments, TSV 60 and capacitor 62 may extend beyond front surface 20a of substrate 20. For example, TSV 60 and capacitor 62 may extend into the ILD (not shown) over active devices 24.

Figure 9B:
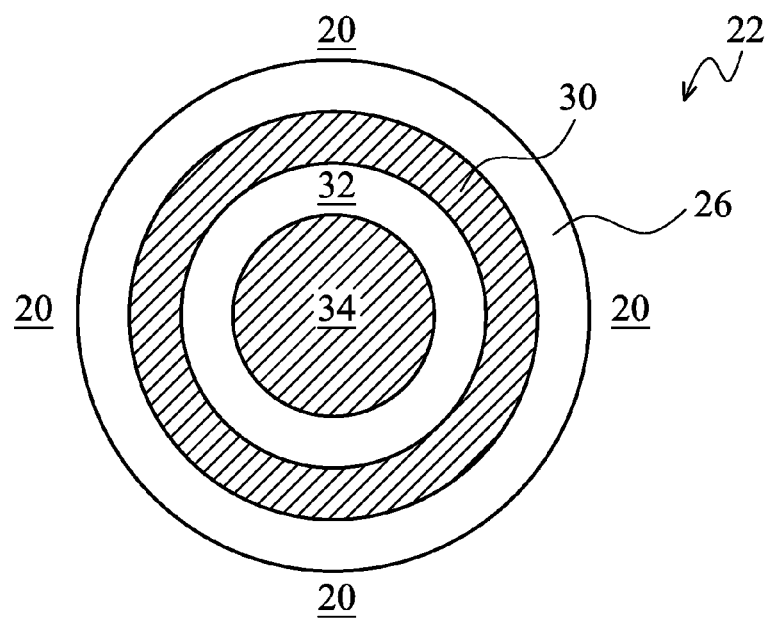
FIG. 9B illustrates a top view of the embedded capacitor as shown in FIG. 9A.

FIG. 9B illustrates a top view of a portion of the structure show in FIG. 9B, wherein the top view is obtained from the plane crossing line 9B-9B in FIG. 9A. It is observed that capacitor plate 30 has a ring shape, insulation layer 32 has a ring shape, and capacitor plate 34 has a cylindrical shape that is encircled by the ring-shaped plate 30 and layer 32. Further, capacitor 62 has a cylindrical shape. Although capacitor plate 30 and insulation layer 32 are shown as circular rings in FIG. 9B, they may also form rings having different shapes, for example, rectangular top-view shapes, depending on the top-view shape of opening 224 in FIG. 1.

Figure 10A:
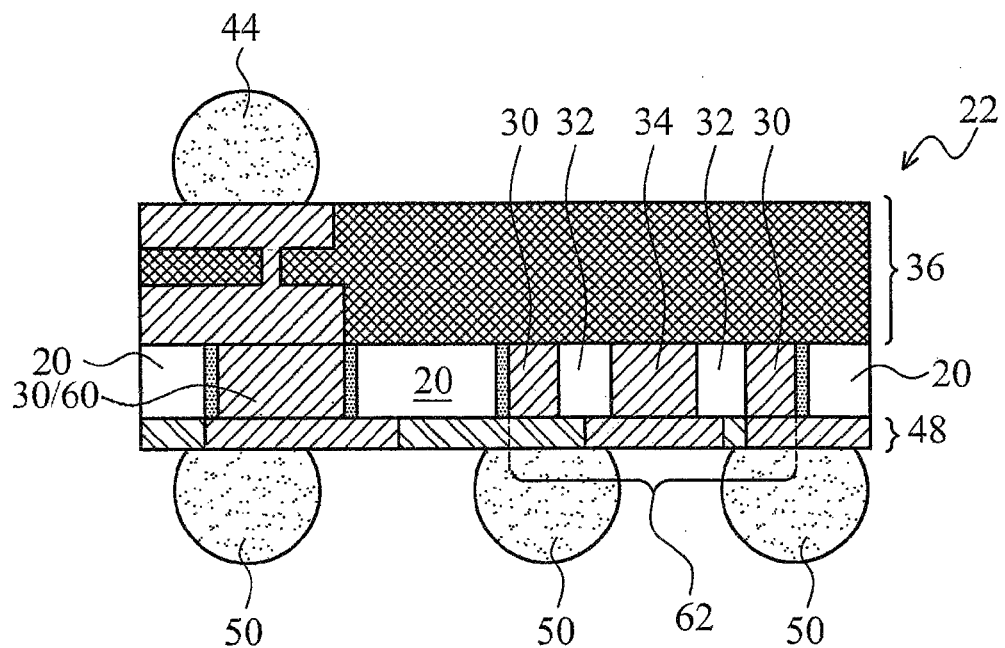
FIGS. 10A through 11 illustrate cross-sectional views of capacitors in accordance with alternative embodiments.
Figure 10B:
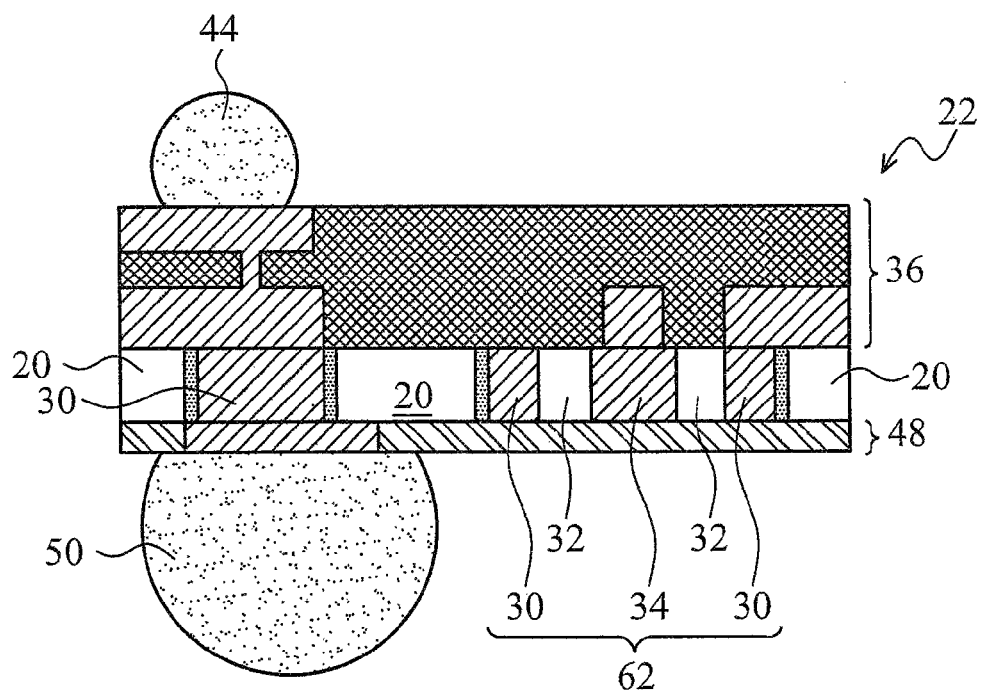

FIG. 10A illustrates embedded capacitor 62 in accordance with an alternative embodiment, wherein capacitor 62 is electrically coupled to backside metal bumps 50. In FIG. 10B, another embodiment is shown, in which no front-side metal bumps and no back-side metal bumps are electrically coupled to capacitor 62. In this embodiment, wafer 22 may be a device wafer, and capacitor 62 may be electrically coupled to the integrated circuits (not shown) formed in wafer 22.

Figure 11:
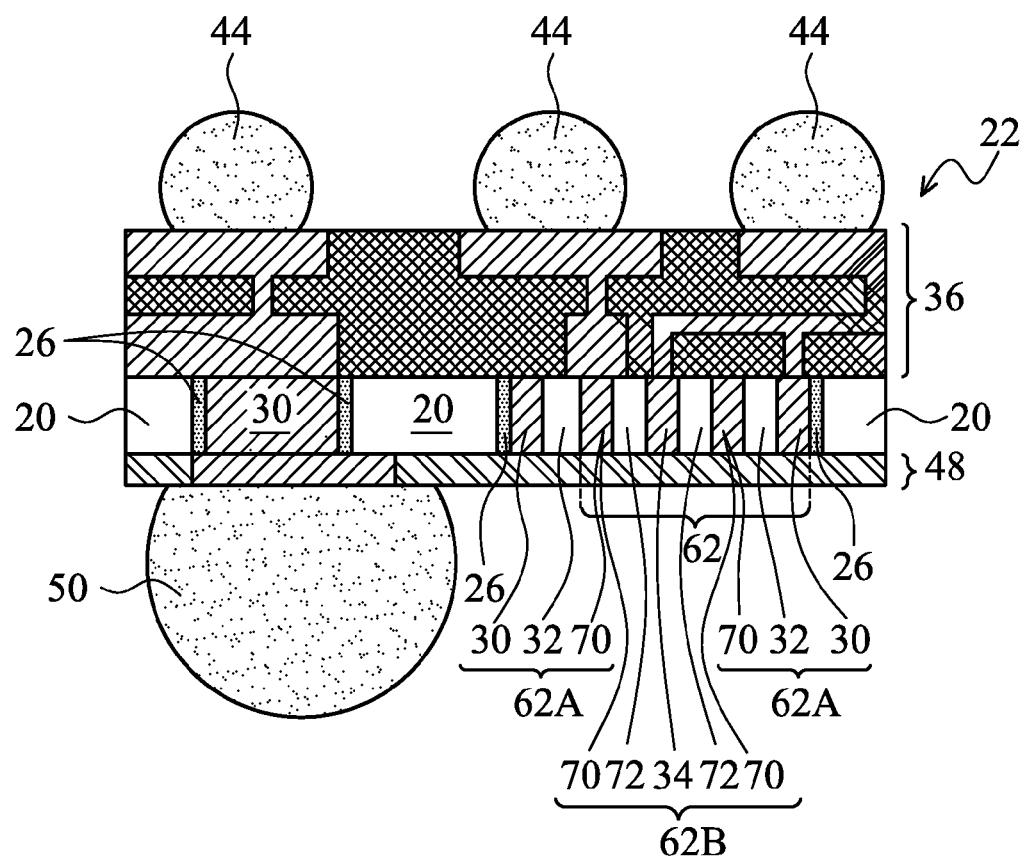

FIG. 11 illustrates an alternative embodiment, wherein cylindrical capacitor 62 includes two capacitor insulation layers and three capacitor plates. Capacitor insulator 32 and capacitor plates 30 and 70 form a first capacitor 62A, while capacitor insulator 72 and capacitor plates 70 and 34 form a second capacitor 62B, with the first and the second capacitors being coupled in parallel through a metal connection including metal line(s) 40 and vias 42. Accordingly, the capacitance of capacitor 62 equal to the sum of the capacitances of the first and the second capacitors. The formation process is similar to what are shown in FIGS. 1 through 9A, except conductive layer 70 and insulation layer 72 are formed between the step shown in FIG. 4 and the step shown in FIG. 5.

Since embedded capacitor 62 extends from front surface 20a to back surface 20b of substrate 20, the resulting capacitance of capacitor 62 is high due to the great depth of substrate 20. When formed in interposers that do not include active devices, capacitors 62 may use unused interposer area and no longer occupies chip area.

In accordance with an embodiment, device includes a substrate having a front surface and a back surface opposite the front surface. A capacitor is formed in the substrate and includes a first capacitor plate; a first insulation layer encircling the first capacitor plate; and a second capacitor plate encircling the first insulation layer. Each of the first capacitor plate, the first insulation layer, and the second capacitor plate extends from the front surface to the back surface of the substrate.

In accordance with other embodiments, a device includes an interposer, wherein no active device is formed in the interposer. The interposer includes a silicon substrate having a front surface and a back surface opposite the front surface; a capacitor extending from the top surface to the back surface; and an isolation layer extending from the top surface to the back surface, wherein the isolation layer is between and contacting the silicon substrate and the capacitor In accordance with yet other embodiments, a device includes a silicon substrate comprising a front surface and a back surface opposite the front surface, and a capacitor. The capacitor includes a first capacitor plate having a cylindrical shape; a first insulation layer encircling the first capacitor plate; a second capacitor plate encircling the first insulation layer; a second insulation layer encircling the second capacitor plate; and a third capacitor plate encircling the second insulation layer. The first, the second, and the third capacitor plates and the first and the second insulation layers extend from the front surface to the back surface of the silicon substrate. An isolation layer is disposed between and contacting the third capacitor plate and the silicon substrate, wherein the isolation layer extends from the front surface to the back surface of the silicon substrate.

In accordance with yet other embodiments, a method includes providing a substrate comprising a first surface and a second surface opposite the first surface; etching the substrate to form a first opening extending from the first surface into the substrate; forming a first conductive layer on sidewalls of the first opening; forming a first insulation layer in the first opening and over the first conductive layer; forming a second conductive layer in the first opening and over the first insulation layer; and grinding the second surface of the substrate until the first and the second conductive layers and the first insulation layer are exposed, wherein the first and the second conductive layers and the first insulation layer form a capacitor.

In accordance with yet other embodiments, a method includes providing a substrate comprising a front surface and a back surface opposite the front surface; etching the substrate to simultaneously form a first opening and a second opening extending from the front surface into the substrate; forming a first conductive layer to partially fill a portion of the first opening, wherein the second opening is fully filled with the first conductive layer; forming a first insulation layer in the first opening and over the first conductive layer; forming a second conductive layer in the first opening and over the first insulation layer; performing a planarization to remove excess portions of the first and the second conductive layers and the first insulation layer outside the first and the second openings; and grinding the back surface of the substrate until the first and the second conductive layers and the first insulation layer are exposed. The first and the second conductive layers and the first insulation layer form a capacitor in the first opening, and the first conductive layer forms a through-substrate via (TSV) in the second opening.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate having a first region and a second region;
   a capacitor formed in the first region of the substrate and comprising:
      a first capacitor plate;
      a first insulation layer encircling the first capacitor plate;
      a second capacitor plate encircling the first insulation layer, wherein each of the first capacitor plate, the first insulation layer, and the second capacitor plate extends from a front surface of the substrate to a back surface of the substrate;
      a second insulation layer encircling the second capacitor plate; and
      a third capacitor plate encircling the second insulation layer, wherein each of the second insulation layer and the third capacitor plate extends from the front surface to the back surface of the substrate;
   metal lines and vias connecting the first capacitor plate to the third capacitor plate;
   a through-substrate via (TSV) formed in the second region of the substrate and extending from the front surface to the back surface of the substrate, wherein the TSV and the second capacitor plate are formed of a same conductive material comprising same elements and same percentages of the elements; and
   a second isolation layer between the TSV and the substrate.

2. The device of claim 1, further comprising a first isolation layer extending from the front surface to the back surface of the substrate and encircling the capacitor.

3. The device of claim 1, wherein the capacitor has a cylindrical shape.

4. The device of claim 3, wherein the first capacitor plate forms a solid cylinder, and wherein each of the first insulation layer and the second capacitor plate forms a circular ring.

5. The device of claim 1, wherein the substrate is a semiconductor substrate, and wherein no active device is formed at the front surface or the back surface of the semiconductor substrate.

6. The device of claim 1, further comprising a metal bump electrically coupled to one of the first and the second capacitor plates.

7. A device comprising:
   an interposer, wherein no active device is formed in the interposer, and wherein the interposer comprises:
      a silicon substrate having a first region and a second region;
      a capacitor formed in the first region of the silicon substrate and extending from a front surface to a back surface of the silicon substrate, wherein the capacitor comprises:
         a first capacitor plate;
         a first insulation layer encircling the first capacitor plate; and
         a second capacitor plate encircling the first insulation layer, wherein each of the first capacitor plate, the first insulation layer, and the second capacitor plate extends from the front surface to the back surface of the silicon substrate;
         a second insulation layer encircling the second capacitor plate; and
         a third capacitor plate encircling the second insulation layer, wherein each of the second insulation layer and the third capacitor plate extends from the front surface to the back surface of the silicon substrate;
      metal lines and vias connecting the first capacitor plate to the third capacitor plate; and
      a first isolation layer extending from the front surface to the back surface of the silicon substrate, wherein the isolation layer is between and contacting the silicon substrate and the capacitor.

8. The device of claim 7 further comprising:
   an interconnect structure overlying the front surface of the silicon substrate; and
   a metal bump overlying the interconnect structure and electrically coupled to the capacitor through the interconnect structure.

9. The device of claim 7 further comprising:
   a first metal bump on a front side of the silicon substrate, with the front surface being on the front side;
   a second metal bump on a backside of the silicon substrate, with the back surface being on the backside; and
   a through-substrate via (TSV) formed in the second region of the silicon substrate and extending from the front surface to the back surface of the silicon substrate, wherein the TSV electrically couples the first metal bump to the second metal bump.

10. The device of claim 1, wherein the substrate comprises a semiconductor material, and wherein the second isolation layer is in contact with the TSV and the substrate.

11. A device comprising:
    a substrate having a first major surface and a second major surface, wherein the substrate comprises a semiconductor material;
    a capacitor having:
       an inner capacitor plate extending through the substrate from the first major surface through to the second major surface;
       a capacitor dielectric surrounding the inner capacitor plate and extending through the substrate from the first major surface through to the second major surface; and
       an outer capacitor plate surrounding the capacitor dielectric and extending through the substrate from the first major surface through to the second major surface;
    a first electrical contact on the first major surface and electrically contacting the inner capacitor plate;
    a second electrical contact on the first major surface and electrically contacting the outer capacitor plate;

a first liner surrounding the outer capacitor plate and extending from the first major surface through to the second major surface;
  a conductive through via extending from the first major surface through to the second major surface; and
  a second liner surrounding the through via and extending from the first major surface through to the second major surface, wherein the first liner and the second liner are formed of a same dielectric material having same first elements and same percentages of the first elements, and wherein the second liner is in contact with the through via and the substrate.

12. The device of claim 11 wherein the conductive through via has a first diameter and the outer capacitor plate has a second diameter, the second diameter being larger than the first diameter.

13. The device of claim 11 wherein the capacitor dielectric is in the shape of an annulus and the outer capacitor plate is in the shape of an annulus.

14. The device of claim 11 further comprising a first solder bump formed on the first major surface and a second solder bump formed on the second major surface.

15. The device of claim 11, wherein the outer capacitor plate and the through via are formed of a same conductive material having same second elements and same percentages of the second elements.

* * * * *